United States Patent [19]
Pan

[11] Patent Number: 5,670,410
[45] Date of Patent: Sep. 23, 1997

[54] METHOD OF FORMING INTEGRATED CMP STOPPER AND ANALOG CAPACITOR

[75] Inventor: Yang Pan, Singapore, Singapore

[73] Assignee: Chartered Semiconductor Manufacturing PTE Ltd., Singapore, Singapore

[21] Appl. No.: 719,347

[22] Filed: Sep. 25, 1996

[51] Int. Cl.$^6$ .................. H01L 21/70; H01L 27/00
[52] U.S. Cl. .................. 437/60; 437/919; 437/225; 148/DIG. 14
[58] Field of Search .................. 437/52, 60, 919, 437/225; 148/DIG. 14; 156/636.1

[56] References Cited

U.S. PATENT DOCUMENTS

| | | | |
|---|---|---|---|
| 5,173,437 | 12/1992 | Chi | 437/60 |
| 5,312,512 | 5/1994 | Allman et al. | 156/636 |
| 5,332,684 | 7/1994 | Yamamichi et al. | 437/52 |
| 5,364,811 | 11/1994 | Ajika et al. | 437/52 |
| 5,399,518 | 3/1995 | Sim et al. | 437/52 |
| 5,456,756 | 10/1995 | Ramaswami et al. | 118/721 |

Primary Examiner—Jey Tsai
Attorney, Agent, or Firm—George O. Saile

[57] ABSTRACT

An analog capacitor is formed as part of an integrated circuit, using normal manufacturing methods, and then the upper electrode of this capacitor is used as part of the end point detection scheme during chem.-mech. polishing (CMP). Said upper electrode is formed from polysilicon and as soon as its upper surface is exposed as a result of the CMP, the presence of silicon particles in the removed material is readily detected by one of several possible methods.

13 Claims, 2 Drawing Sheets

METHOD OF FORMING INTEGRATED CMP STOPPER AND ANALOG CAPACITOR

BACKGROUND OF THE INVENTION

(1) Field of the Invention

The invention relates to the general field of chemical-mechanical polishing, more particularly to end point detection, and the formation of an analog capacitor.

(2) Description of the Prior Art

In integrated circuit technology, the removal of various layers is usually accomplished through use of liquid or gaseous etchants. In these cases, the reaction products are fluids that are readily removed from the reaction site so that etching can proceed at a uniform rate. In certain cases, however, the reaction products are insoluble solids that are, at best, hard to remove. At worst, such etchants serve only to undermine, or weaken, the layer's integrity near the surface and, in the absence of any other action, are thus quite ineffective as etchants.

In etching situations of this sort, mechanical assistance in the form of a slurry comprising an abrasive powder suspended in a suitable liquid medium (such as the etchant itself) can be used to complement the action of the chemical etchant. This technique for removing material through a combination of chemical and mechanical means is referred to as Chemical Mechanical Polishing (CMP).

CMP is growing in popularity as a method for planarizing integrated circuits (ICs) since a planar etch front, independent of the material being removed, is always obtained. An important part of the overall CMP methodology is being able to determine as cheaply as possible exactly when to stop the process. That is, an end point detector is needed to signal when exactly the desired amount of material has been removed.

A number of ways for accomplishing cheap and efficient end point detection have been proposed in the prior art. In one of these methods a layer of a material that is different from the material being removed is included within the latter. The thickness of this 'marker' material is made to equal the final thickness intended for the layer that is being subjected to CMP. Means for detecting the presence of marker material in the material being removed as CMP proceeds are provided so that a signal to stop can be sent out as soon as the marker layer is reached. We are unaware of any use, in the prior art, of polysilicon in this way.

Capacitors are commonly used in ICs. Often, such capacitors will need to have relatively high values and so must be formed from multiple layers of electrodes and dielectric. There are, however, a number of situations in which low valued analog capacitors having only a single dielectric layer are needed. Capacitors of this type would have capacitances in the range of from about 0.05 to 0.5 femtofarads. Circuits, such as analog or mixed mode for example, make use of capacitors in this range. In the prior art, analog capacitors of this type, when needed, are specially made as part of a set of extra steps that must be added to the overall IC manufacturing process.

We are unaware of any prior art which combines the processes of making a CMP end point detector with the manufacture of an analog capacitor. Ramaswami et al. (U.S. Pat. No. 5,456,756 October 1995) modifies the wafer holding clamp so that alignment marks are protected against a metal deposition process that takes place after CMP has been applied. No consideration is given to the problem of end point detection.

Allman et al. (U.S. Pat. No. 5,312,512 May 1994) make mention of the use of a hard refractory metal as an etch stop but no further details are given. The principal purpose of using the refractory metal layer is to suppress hillock growth in aluminum lines. No mention is made of capacitor formation.

Chi (U.S. Pat. No. 5,173,437 December 1992) describes a process for manufacturing a capacitor that has polysilicon electrodes and uses the inter-metal dielectric layer as the capacitor dielectric but CMP is not a part of the methodology.

SUMMARY OF THE INVENTION

It has been an object of the present invention to provide, as part of an integrated circuit, a structure wherein an analog capacitor and a CMP end point detector are integrated as a single unit.

Another object of the present invention has been to provide a method wherein an analog capacitor and a CMP end point detector may be simultaneously manufactured at no greater cost than manufacturing either one alone.

These objects have been achieved by forming an analog capacitor as part of the integrated circuit, using normal manufacturing methods, and then utilizing the upper electrode of the analog capacitor as part of the end point detection scheme. Said upper electrode is formed from polysilicon and as soon as its upper surface is exposed as a result of the CMP, the presence of silicon particles in the removed material is readily detected by one of several possible methods.

DESCRIPTION OF THE PREFERRED EMBODIMENTS

Figure 1:
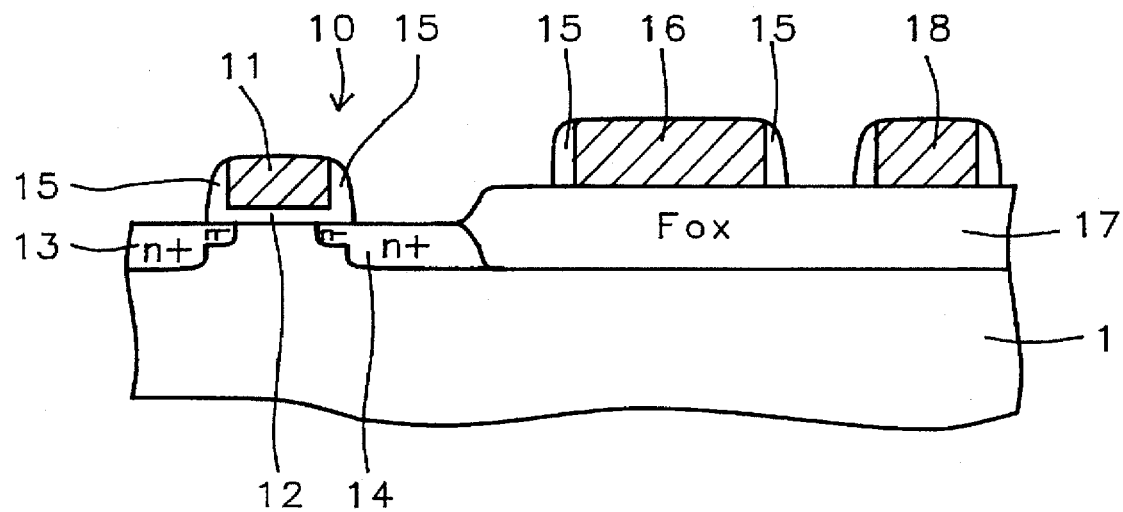
FIG. 1 shows a single FET device adjacent to a region of field oxide on which has been formed a lower electrode.

Referring to FIG. 1, the method of the present invention begins with the provision of an integrated circuit. Active device 10, consists of gate oxide 12, gate electrode 11, source and drain regions, 13 and 14 respectively. The latter are shown in the figure as being of the Lightly Doped Drain (LDD) variety, wherein thin N− regions are connected to thicker N+ areas, but, for the purposes of the invention, any type of semiconductor device, including conventional FETs, bipolar devices, diodes, etc. could have been used. Also seen are oxide spacers 15 which are a byproduct of the LDD process.

Device 10 has been formed on the upper surface of P-type semiconductor substrate 1. Immediately adjacent to device 10 is Field Oxide (FOX) region 17. This is a layer of thick insulation (usually silicon oxide) that will serve to electrically isolate devices such as 10 from one another. Also seen in FIG. 1 is lower electrode 16. This was formed by depositing a layer of polysilicon by means of Low Pressure Chemical Vapor Deposition (LPCVD), to a thickness between about 0.2 and 0.5 microns, and then patterning and etching it to the desired shape and area. Typical linear dimensions for lower electrode 16 are between about 0.5 and 500 microns. The resistivity of this polysilicon layer is between about 0.1 and 5 ohm-cms. Alternatively, a tungsten silicide or titanium silicide layer over the polysilicon layer may be used to reduce the resistivity to between 0.01 and 0.2 ohm-cm. Not seen is a connector, also of polysilicon, to lower electrode 16. 18 represents yet another connector line of polysilicon for use elsewhere in the circuit.

As mentioned above, the oxide spacers 15 are a byproduct of the LDD process but there is no need to remove them so they are left in place. Note that top layer 36 will be acting as the CMP end point marker.

Figure 2:
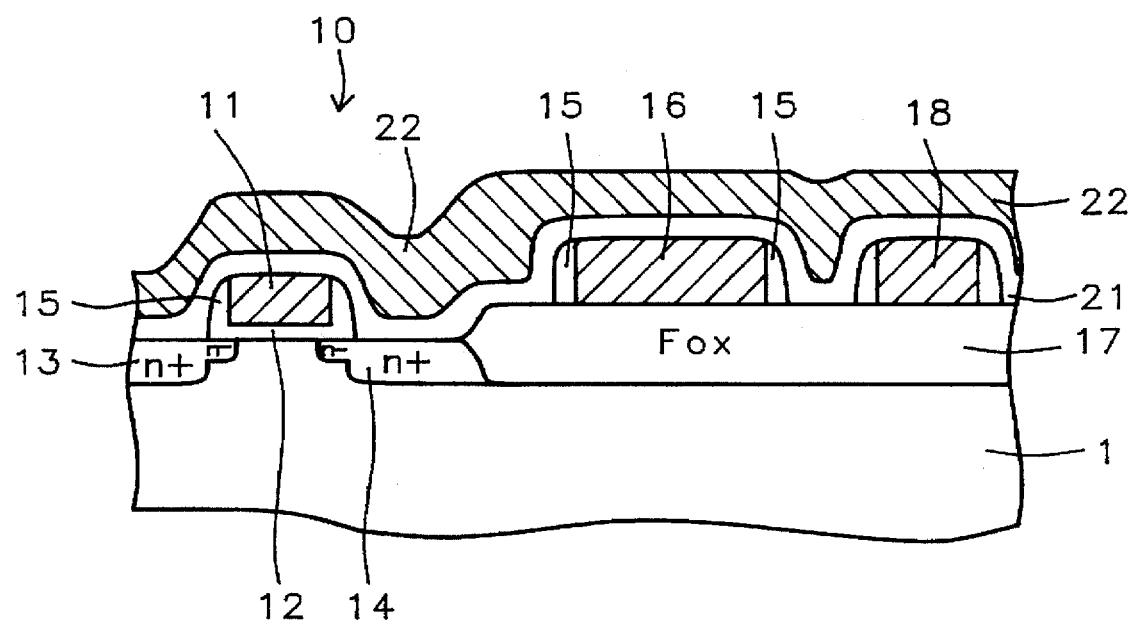
FIG. 2 shows FIG. 1 following the successive deposition of layers of polysilicon and insulation.
Figure 3:
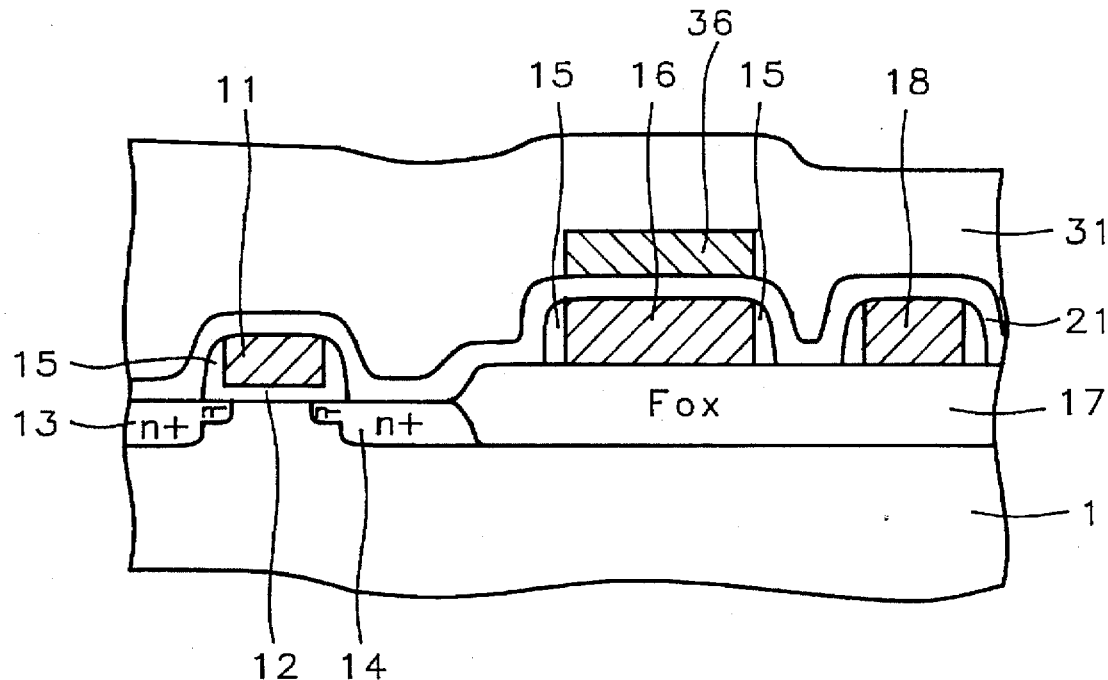
FIG. 3 shows FIG. 2 with a completed analog capacitor in place as well as a planarizing layer of insulation.

Referring now to FIG. 2, insulating layer 21, consisting of tetra-ethyl-orthosilicate (TEOS), normally used to block boron and phosphorus diffusion from the boro-phospho TEOS (BPTEOS) or boro-phosphosilicate glass (BPSG) between 1st level metal and polysilicon, between about 200 and 1,500 Angstroms thick, and polysilicon layer 22, between about 0.2 and 0.6 microns thick and having a resistivity between about 0.1 and 5 ohm-cms., are successively deposited over the entire structure. Polysilicon layer 22 is then patterned and etched to form upper electrode 36 as shown in FIG. 3. Electrode 36 is approximately the same shape and area as lower electrode 16 which it overlies. This combination of electrodes 16 and 36, together with dielectric layer 21 constitutes an analog capacitor.

Insulating layer 31, consisting of BPSG, BPTEOS, borosilicate glass (BSG), phosphosilicate glass (PSG), or TEOS is now deposited over layer 21 to a thickness between about 0.5 and 1.5 microns, as shown in FIG. 3. Layer 31 will be used to planarize the structure and is the layer that will be subjected to CMP. As discussed earlier, CMP is accomplished by using a combination of chemical etching and mechanical abrasion. To effect the latter, a slurry, applied to the surface via a rotating platen or polishing head, is used. The CMP operation is not shown.

Figure 4:
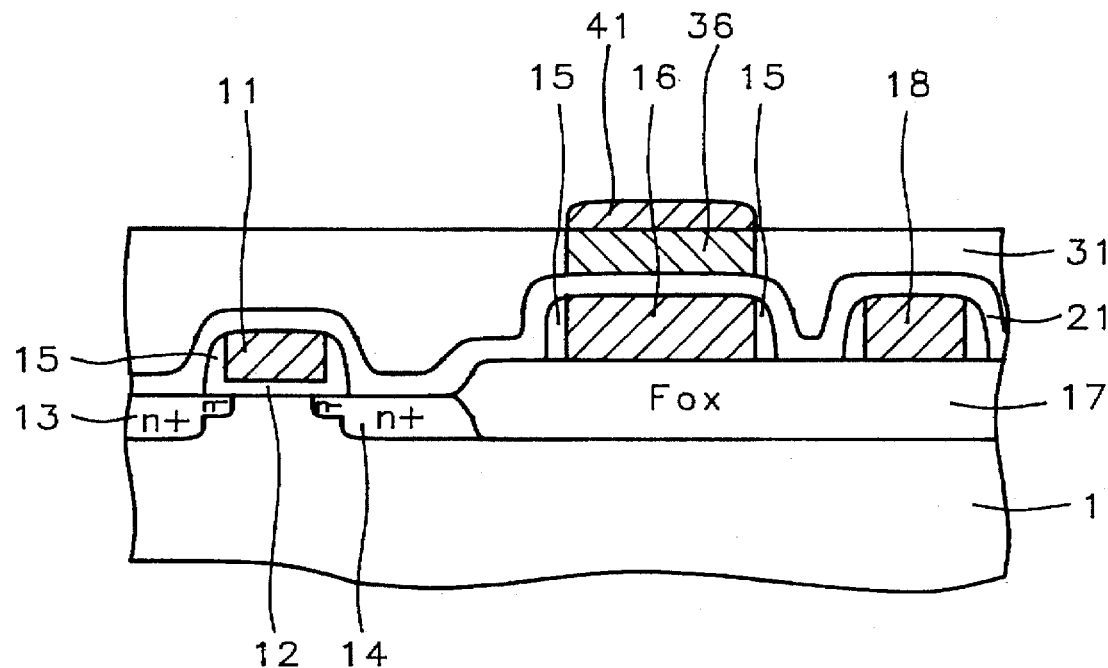
FIG. 4 shows the completed structure of the invention.

Referring now to FIG. 4, CMP is allowed to continue, causing layer 31 to get progressively thinner until the top surface of upper electrode 36 is exposed. At this point silicon particles begin to form part of the material that is being removed as a result of the CMP. The change from particles coming only from layer 31 to a mix of these and silicon particles can be sensed in several ways, of which we will give two examples:

(a) Because the polysilicon layer is harder, the polishing head sees a greater load as it tries to maintain its speed of rotation. This is reflected in an increase in the current needed to power the drive motor and this is easily sensed.

(b) The presence of the silicon particles increases the internal friction of the slurry because the polysilicon layer is both harder and rougher. As a result, the slurry now runs hotter than it did before. A simple temperature sensor located inside the polishing head can therefore be used as the sensing mechanism.

In order to make electrical contact to upper electrode 36 it is possible to form a connector running along the surface of layer 21. This, however, gives rise to unintended, parasitic, capacitances. A preferred solution is to deposit conductive connecting layer 41 directly over the now exposed upper surface of 36. In practice, 41 would be part of a more general network of connecting wiring known as first level metal (M1). Connector 41 is typically made of aluminum, tungsten, or copper.

It should also be noted that redundant capacitor structures can be placed on the unused field oxide area to improve CMP oxide uniformity and reduce dishing effects (arising from non-uniform material removal). We also observe here that tungsten could be used as the material for the top plate of the capacitor.

While the invention has been particularly shown and described with reference to the preferred embodiments thereof, it will be understood by those skilled in the art that various changes in form and details may be made without departing from the spirit and scope of the invention.

What is claimed is:

1. A method for end point detection during CMP, including manufacture of an analog capacitor, comprising:

providing an integrated circuit having active devices electrically isolated from one another by a region of field oxide;

depositing a first layer of polysilicon on the field oxide;

patterning and etching said first polysilicon layer to form a lower electrode and a connector thereto;

depositing a first insulating layer over said first polysilicon layer;

depositing a second polysilicon layer of a first thickness over said first insulating layer;

patterning and etching said second polysilicon layer to form an upper electrode that overlies the lower electrode, thereby forming an analog capacitor;

depositing a second insulating layer over said second polysilicon layer to a thickness greater than said first thickness; and using a polishing head, applying CMP to the second insulating layer until the presence of polysilicon in the removed material is detected.

2. The method of claim 1 wherein the first and second polysilicon layers are deposited by Low Pressure Chemical Vapor Deposition.

3. The method of claim 1 wherein the thickness of the first polysilicon layer is between about 0.2 and 0.5 microns.

4. The method of claim 1 wherein the resistivity of the first polysilicon layer is between about 0.1 and 5 ohm-cms.

5. The method of claim 1 wherein the first insulating layer comprises tetra-ethyl orthosilicate.

6. The method of claim 1 wherein the thickness of the first insulating layer is between about 0.02 and 0.15 microns.

7. The method of claim 1 wherein the thickness of the second polysilicon layer is between about 0.2 and 0.6 microns.

8. The method of claim 1 wherein the resistivity of the second polysilicon layer is between about 0.1 and 5 ohm-cms.

9. The method of claim 1 wherein the second insulating layer is taken from the group consisting of BPSG, BPTEOS, BSG, PSG, and TEOS.

10. The method of claim 1 wherein the thickness of the second insulating layer is between about 0.5 and 1.5 microns.

11. The method of claim 1 further comprising:

following CMP, depositing a layer of conductive material over said upper electrode and field oxide; and etching said layer of conductive material to form a pattern that includes a connector to said upper electrode.

12. The method of claim 1 wherein the detection of the presence of polysilicon in the removed material further comprises sensing a change in load by the polishing head.

13. The method of claim 1 wherein the detection of the presence of polysilicon in the removed material further comprises sensing a change in the temperature of the polishing head.

* * * * *